United States Patent [19]

Muruska et al.

[11] 4,331,707

[45] May 25, 1982

[54] PROCESS FOR THIN FILM DEPOSITION OF CADMIUM SULFIDE

[75] Inventors: H. Paul Muruska, East Windsor; Joseph L. Sansregret, Scotch Plains; Archie R. Young, Montclair, all of N.J.

[73] Assignee: Exxon Research & Engineering Co., Florham Park, N.J.

[21] Appl. No.: 197,082

[22] Filed: Oct. 15, 1980

[51] Int. Cl.$^3$ .................... B05D 1/02; B05D 3/02; B05D 3/04
[52] U.S. Cl. ................................. 427/74; 427/84; 427/85; 427/87
[58] Field of Search .................. 427/74, 84, 85, 87

[56] References Cited

U.S. PATENT DOCUMENTS 4,095,004  6/1978  Fraas et al. ................ 427/74

Primary Examiner—James R. Hoffman
Attorney, Agent, or Firm—Paul E. Purwin

[57] ABSTRACT

The present invention teaches a process for depositing layers of cadmium sulfide. The process includes depositing a layer of cadmium oxide by spray pyrolysis of a cadmium salt in an aqueous or organic solvent. The oxide film is then converted into cadmium sulfide by thermal ion exchange of the $O^{-2}$ for $S^{-2}$ by annealing the oxide layer in gaseous sulfur at elevated temperatures.

22 Claims, No Drawings

PROCESS FOR THIN FILM DEPOSITION OF CADMIUM SULFIDE

The subject invention was made in the course of research performed for the Solar Energy Research Institute Under Subcontract No. XS-908104-1 from Prime Contract No. EG-77-C-01-4042.

BACKGROUND OF THE INVENTION

The present invention relates to thin films of cadmium sulfide and in particular to a chemical spray deposition process employed in conjunction with a thermal ion exchange process for producing cadmium sulfide, abbreviated herein as CdS.

Cadmium sulfide is a well-known photoconductive semiconductor. Its principal use has been in photodetectors and photovoltaic solar cells (CdS/Cu$_2$S cells). In thin film form, these devices display relatively high efficiency at potentially low fabrication costs. Conventionally, these films of CdS are constructed by one of two techniques; at the Institute for Energy Conversion (University of Delaware) for example, vacuum evaporation techniques are used to deposit 20–40 micron layers of CdS on metal substrates. A second technique, used commercially by Photon Power, Inc. of El Paso, Texas, spray deposits CdS from a solution containing CdCl$_2$ with thiourea as a sulfur source. Specific examples of this technique may be referenced in U.S. Pat. Nos. 4,086,101 and 4,095,006. Both of these techniques produce cadmium sulfide, CdS, directly.

In contrast, the present invention teaches a process for chemical spray deposition of a layer of cadmium oxide which is converted to cadmium sulfide by thermal ion exchange. The deposition of the intermediary oxide is thermodynamically more stable then directly depositing the sulfide, resulting in superior film quality. As taught with respect to differing metals and metal oxides, in a co-pending application, U.S. Ser. No. 31,421 filed Apr. 29, 1979 and assigned to the assignee of the present invention, a more precise control of the film composition may be readily obtained by first depositing an intermediary oxide layer.

SUMMARY OF THE INVENTION

The present invention teaches a process for depositing films of CdS by first forming a layer of cadmium oxide by spray pyrolysis of a cadmium salt in air and secondly converting the oxide to the sulfide by thermal ion exchange. Spray deposition in air of solutions of cadmium salts in water and/or methanol produce an intermediary cadmium oxide layer which is thermodynamically favorable compared to direct deposition of CdS. Thermal ion exchange comprises annealing the oxide in the presence of a sulfide ion to produce a cadmium sulfide layer having preferred electrical and crystallographic properties.

The CdS layers as taught herein may be used in photoconductive applications such as CdS/Cu$_2$S heterojunction solar cells.

DETAILED DESCRIPTION OF THE INVENTION

In accordance with the teaching of the present invention, cadmium sulfide films are fabricated by first depositing a layer of cadmium oxide by spray pyrolysis of a cadmium salt solution followed by an annealing of the oxide layer at elevated temperature in the presence of a sulfide ion whereby a thermally induced ion exchange of the sulfur for oxygen produces cadmium sulfide.

A spray solution comprises a mixture of at least one cadmium salt in solution with either water, an organic solvent or a combination thereof. Representative cadmium salts include cadmium nitrate Cd(NO$_3$)$_2$, cadmium acetate Cd(C$_2$H$_3$O$_2$)$_2$ and other Cd salts of oxygen containing anions.

Representative organic solvents include methanol, ethanol, isopropanol and acetone. A solution concentration of cadmium salt ranging from about 0.01 M to about 0.5 M has been evidenced as operable in the present invention. In a preferred embodiment a solution concentration of about 0.2 M produces strongly adherent films of cadmium oxide using the spray deposition parameters set forth hereinafter.

In its basic sense, the oxide film is formed by pyrolysis of the cadmium salt; for example:

$$Cd(NO_3)_2 \xrightarrow{\Delta} CdO + 2NO_2 + \tfrac{1}{2} O_2$$

It is known in the art that film quality is often strongly dependent on the specific chemistry involved in the film growth process (see for example; *Journal of Vacuum Science and Technology*, J. Ceranovich et al., 16, 994, (1979)). In the direct spray deposition techniques known in the art, the impinging flux of molecules must undergo a chemical reaction on the deposition surface. For example, when CdS is deposited with thiourea as a sulfur source, the sulfur reducing conditions in the vicinity of the spray impact must be carefully maintained, typically by control of the spray solvent. In contrast, the herein taught formation of an oxide film is thermodynamically favored and the resultant sulfide film is both strongly adherent and of controlled composition. The spray solution is atomized by a conventional spraying device, modified to permit control and monitor of fluid and air flow rates. A suitable substrate, heated to a temperature ranging from about 300° C. to about 500° C., is contacted with the atomized solution to form the oxide film. The substrate comprises a thermally conductive material capable of retaining its physical integrity throughout the range of deposition and annealing temperatures. The selection of substrates is generally dictated by the intended application of the completed semiconductor device. In photocells, for example, optically transparent substrates such as specialty glass, sapphire, quartz or the like may be used where intended illumination would be through the substrate (so called Backwall Cell). Electrical contact to the cadmium sulfide underlayer may be achieved by first coating the transparent substrate with a metallic grid or a conductive oxide, such as SnO$_2$ or In$_2$O$_3$, means for which are well-known in the art. Metal substrates such as molybdenum and tungsten or ceramic substrates coated with a suitable metal for contacting the back layer may be used where substrate transparency is not contemplated in the finalized device (a so called Frontwall Cell).

To promote thermal decomposition of the spray solution, the substrate temperature is maintained, as a minimum, at about 300° C. The measurement of this temperature, however, is at the substrate/heater interface. The actual film temperature during the deposition process will be proportionally lower. In a preferred embodiment, however, the substrate temperature is maintained at about 450° C. to assure complete pyrolysis of the spray solution. To accomplish this, there is required both a relatively high value of thermal conductance between the heat source and the surface of the substrate to be coated, and a sufficient thermal mass to sustain the substrate temperature throughout the thermal extraction experienced during the spray deposition process. This has been achieved by either floating the substrate in a molten metal maintained at the desired temperature, or, alternatively, using a vacuum chuck to hold the substrate in contact with the heat source during the spray process.

In the spray deposition of the liquid solution, a number of alternative conventional atomizing devices may be used. For example, ultrasonic, pneumatic, electrostatic or vibrational atomizing devices may be used to provide a spray or mist of the liquid solution. It is generally preferred in the practice of the present invention to use a pneumatic spraying device, in which the gas used to atomize the liquid solution is compressed air.

As is well-known, spray guns typically subdivide liquid solutions into droplets having diameters generally in the range of about 10 to 1,000 microns, whereas misting devices generate or subdivide liquid solutions into droplets having diameters in the range of about 0.1 to 100 microns. While the size of the droplets produced during atomization of the cadmium salt in the alcohol and water solvents have not been shown to be critical, it is desirable that the droplets be generally below 1,000 microns in diameter. As indicated above, conventional liquid spray devices will produce such an atomized stream of the liquid solution.

Film growth rate is dependent upon liquid flow rate, being in turn dependent upon the degree of atomization. It should be readily recognized that flow rate deposition parameters are dependent upon the type of spray apparatus employed and the detailed discussion of which, contained hereinafter, is by way of example for a particular spray device. Film growth rates at least during the nucleation and initial film growth, have been shown to also be dependent upon substrate selection, demonstrating an increased deposition rate on glass as compared to tin oxide coated glass, for example. In general, however, film growth rate will range from about 0.01 microns/min. to about 0.2 microns/min. For thicker film construction, that is film thickness greater than about 5 microns, intermittant spraying may be used to advantage. The film growth rate is independent of substrate temperature in the range of 300° to 540° C., indicating mass transport rather than surface kinetics controls the growth rate.

The spray deposited cadmium oxide film are generally characterizable as strongly adherent, golden brown in color, but optically transparent, and having a preferred crystalline orientation which is dependent upon the solution solvent used. For example, aqueous cadmium nitrate produced oxide films having a preferred <200> crystallite orientation whereas a methanol solution of cadmium nitrate deposits oxide films having a <111> preferred crystallite orientation. Empirical data indicates film densities relatively close to reported values of bulk cadmium oxide, about 8.15 g/cm$^3$.

The cadmium oxide film is converted to cadmium sulfide, CdS, by annealing the oxide film in an ambient containing sulfide ion. A thermally induced ion exchange provides for substitution of a sulfide ion for an oxide ion; i.e., $S^{-2}$ for $O^{-2}$. The oxide film and sulfide containing ambient are heated to a temperature ranging from about 350° C. to about 500° C. In a preferred embodiment, the oxide film is annealed in $H_2S$, hydrogen disulfide gas at about 500° C. for a time period depending upon oxide film thickness. As presently understood, the conversion reaction rate is predominantly controlled by the rate of diffusion of the sulfide ion into the film (or the diffusion of oxygen ions to the film surface). At about 350° C., a conversion rate of cadmium oxide to cadmium sulfide in 20% by weight of $H_2S$ is about 0.3 $\mu$/hr. At about 500° C., the conversion rate is about 1.3$\mu$/hr. The activation energy for the process is 21,000 cal/mole. X-ray diffraction may be used to confirm the extent of conversion to cadmium sulfide. The CdS film is generally characterizable as being golden yellow in color and the film maintains a strong adherence to the substrate. The converted film is crystalline having relatively large crystallites ranging from about 0.5 micron to about 1 micron. The CdS film is of hexagonal wurtzite structure, evidencing a preferred crystallite orientation of 002. The resistivity of the film can be controlled by adding $InCl_3$ to the starting spray solution in amounts up to 10 mole percent. The In concentration in the film will be of the order of 1 ppm. The doped CdS film is electrically characterized as having a non-illuminated resistivity of about 80 ohm-cm and an illuminated (100 mW white light) resistivity of about 4 ohm-cm. In doped CdS produced as described above exhibits intense green photoluminescence at 77° K which is indicative of high quality solar cell material.

In order to increase the grain size to the magnitude generally obtained in evaporated CdS films, i.e. 3-5 microns, the converted films are annealled at 500° C. in a high flow rate of pure $H_2S$. The preferred $H_2S$ flow rate is 500 ml/min for a period of 40-60 minutes. The usual time is 50 minutes. Grain size is determined by the known technique of etching the CdS film in a solution or CuCl and KCN, whereafter the grains can be clearly observed in a scanning electron microscope. Large grain sizes are usually correlated with improved device performance. Directly sprayed CdS films only have grain sizes on the order of 0.1 microns in contrast to the improved grain size of 3-5 microns for annealed films.

To further assist one skilled in the art, the following examples detail specific embodiments of the present invention.

EXAMPLE 1

A spray solution of 0.1 molar cadmium nitrate $Cd(NO_3)_2 \cdot 4H_2O$ and 10 mole % $InCl_3$ in solution with methanol was prepared and loaded into a liquid feed chamber of a Binks pneumatic spray nozzle (Model No. 50-175). The spray system was modified to permit monitoring of the liquid and air flow rates of the sprayer. The fluid feed rate was preadjusted to approximately 3.0 ml/min., the air flow to about 27 liters/minute.

A Corning type 7059 borosilicate glass substrate was placed on a vacuum-hold-down heater and heated to a temperature of about 450° C. This temperature was monitored in the heater, near the surface contacting the substrate, and accordingly may be higher than the temperature of the substrate surface to be coated. The initial spray was shielded from the substrate by mechanical shuttering means until the spray flow visually appeared uniformly dispersed over the area to be covered. Total deposition time was about 15 minutes. During this time, the monitored temperature of the substrate varied from 400° C. to 450° C. The thickness of the deposited film was determined using a Tencor Alpha-Step Profiler which indicated an average film thickness of about 0.4 microns. A portion of the film was subjected to X-ray diffraction analysis which indicated a preferred crystallite orientation of <111>. The film was then annealed in a tube furnace, maintained at a temperature of about 500° C. and having a positive pressure of flowing hydrogen disulfide. The film was annealed for about a ½ hour, during which time the film color changed from a deep brown, characteristic of cadmium oxide, to a golden yellow, characteristic of cadmium sulfide. The flow rate of pure $H_2S$ was then increased to 500 ml/min. for 50 minutes in order to achieve grain growth. After cooling in nitrogen the films were analyzed by X-ray diffraction which indicated complete conversion to CdS with a preferred crystallite orientation of <002> and having a hexagonal structure. The surface morphology of the film was examined using a scanning electron microscope which showed a film surface having relatively large circular features of the order of 20–40 microns in diameter. Etching and re-examination in the electron microscope revealed a grain size of about 3 microns. The films resistivity was determined using a four-point probe which indicated a resistivity of about 60Ω cm.

EXAMPLE 2

The spray deposition apparatus used in Example 2 was identical to that described in Example 1. A spray solution of 0.1 molar cadmium nitrate in water was loaded into the liquid feed chamber of the spraying device. Several samples of cadmium oxide films were deposited varying deposition rate and substrate temperature, the results of which are summarized in Table 1 hereinbelow.

TABLE I

AIR FLOW RATE ≈ 27 l/min.

| Sample # | Temp. (°C.) | Spray Time (min) | Fluid Flow (ml/min) | Film Thickness (microns) | Growth Rate (μ/min) |
|---|---|---|---|---|---|
| 1 | 460 | 5 | 1.2 | .27 | .05 |
| 2 | 470 | 5 | 1.2 | .43 | .09 |
| 3 | 480 | 5 | 1.2 | .39 | .08 |
| 4 | 490 | 5 | 1.2 | .41 | .08 |
| 5 | 500 | 5 | 1.2 | .28 | .06 |
| 6 | 530 | 5 | 1.2 | .45 | .09 |
| 7 | 540 | 5 | 1.2 | .62 | .12 |
| 8 | 460 | 5 | 1.9 | 1.2 | .24 |
| 9 | 470 | 5 | 1.9 | 1.0 | .20 |

These films were converted to CdS by the ion exchange procedure described in Example 1.

EXAMPLE 3

The spray deposition process employed in Example 3 was substantially similar to that of Examples 1 and 2 with the exceptions that the spray solution comprised 0.1 molar cadmium acetate in water and several deposition parameters were varied as summarized in Table 2 hereinbelow.

TABLE 2

Fluid Composition = 0.1M
Air Flow = 27 l/min.
Substrate = glass

| Sample # | Temp (°C.) | Spray Time (min) | Fluid Flow (ml/min) | Film Thickness (microns) | Deposition Rate (micron/min) |
|---|---|---|---|---|---|
| 10 | 450 | 5 | 1.2 | .58 | .11 |
| 11 | 480 | 5 | 1.2 | .6 | .12 |
| 12 | 490 | 5 | 1.2 | .32 | .06 |
| 13 | 500 | 5 | 1.2 | .3 | .06 |
| 14 | 510 | 5 | 1.2 | .59 | .12 |
| 15 | 520 | 5 | 1.2 | .38 | .08 |
| 16 | 530 | 5 | 1.2 | .45 | .09 |

These films were converted to CdS by the ion exchange procedure described in Example 1.

EXAMPLE 4

The spray deposition process employed in Example 4 was substantially similar to that of Examples 1, 2 and 3 with the exceptions that the spray solution comprised 0.1 molar cadmium acetate in methanol and the deposition conditions were varied as summarized in Table 3 hereinbelow.

TABLE 3

Air Flow - 19 l/min.
Substrate - Glass
Fluid Composition - 0.1M

| Sample # | T Temp (°C.) | Spray Time (min.) | Fluid Flow (ml/min) | Film Wt. (mg) | Deposition Rate (mg/min) | Film Thickness (micron) | Deposition Rate (microns/min.) |
|---|---|---|---|---|---|---|---|
| 17 | 500 | 10 | 9 | 1.17 | 0.12 | .28 | .03 |
| 18 | 500 | 10 | 9 | 1.20 | 0.12 | .42 | .04 |
| 19 | 500 | 15 | 9 | 1.84 | 0.12 | .50 | .03 |
| 20 | 500 | 15 | 9 | 2.18 | 0.15 | .54 | .04 |
| 21 | 500 | 20 | 9 | 2.75 | 0.14 | .61 | .03 |
| 22 | 500 | 20 | 9 | 2.21 | 0.11 | .51 | .03 |
| 23 | 500 | 25 | 9 | 3.06 | 0.12 | .74 | .03 |
| 24 | 500 | 25 | 9 | 3.01 | 0.12 | .94 | .04 |

These films were converted to CdS according to the ion exchange procedure described in Example 1.

EXAMPLE 5

The process and apparatus used in constructing the CdS film of Example 5 was substantially identical to those used in Example 1 except that the substrate comprised glass coated with conductive tin oxide. A layer of CdS 4 microns thick was produced. A Schottky junction solar cell was formed by depositing a semitransparent layer of platinum onto the cadmium sulfide. A device capable of solar energy conversion thus resulted. The cell was responsive to light of wavelengths from 515 to 350 mm, as evidenced by the presence of photocurrents upon application of monochromatic light of any of these wavelengths. When the cell was illuminated with 100 mW/cm² simulated sunlight, the short circuit current $Jsc = 5.3$ mA/cm² (corrected for the transmission of the platinum contact), the open circuit voltage $Voc = 0.53$ V, and the conversion efficiency was 1.3%.

EXAMPLE 6

The process and apparatus used in constructing the CdS film of Example 6 was substantially identical to those used in Example 1 except that the substrate comprised glass coated with conductive tin oxide. The exchanged CdS film was 4 microns thick. A copper film 150A thick was thermally evaporated onto the surface to form a CdS/Cu₂S heterojunction cell. This cell was responsive to light of wavelengths from 1000 to 350 nm i.e. the entire visible spectrum, as evidenced by the present of photocurrents upon application of monochromatic light of any of these wavelengths. When the cell was illuminated with 100 mW/cm$^2$ simulated sunlight, the short circuit current Jsc=6.6 mA/cm$^2$, the open circuit voltage Voc=0.33 V, and the conversion efficiency was 0.7%.

What is claimed is:

1. A method for constructing films of cadmium sulfide comprising:
   providing a substrate;
   heating said substrate to a temperature ranging from about 450° C. to about 540° C.;
   providing a solution comprising at least one cadmium salt in water, methanol or a mixture thereof;
   providing an indium salt in said solution to improve conductivity of the final film;
   atomizing said solution;
   contacting said heated substrate with said atomized solution to form a layer of cadmium oxide;
   annealing said oxide layer at a temperature ranging from about 350° C. to about 500° C. in a gaseous sulfur-containing compound capable of undergoing a sulfur exchange with said oxide layer to form cadmium sulfide.

2. The method of claim 1 wherein said cadmium salt comprises cadmium nitrate, cadmium acetate or a mixture thereof.

3. The method of claim 1 wherein said solution comprises cadmium nitrate in water.

4. The method of claim 3 wherein said solution comprises 0.1 M cadmium nitrate, Cd(NO₃)₂ in water.

5. The method of claim 1 wherein said solution comprises cadmium nitrate in methanol.

6. The method of claim 5 wherein said solution comprises 0.1 M cadmium nitrate Cd(NO₃)₂ in methanol.

7. The method of claim 1 wherein said solution comprises cadmium acetate in methanol.

8. The method of claim 7 wherein said solution comprises 0.1 M cadmium acetate, Cd(C₂H₃O₂)₂ in methanol.

9. The method of claim 1 wherein said solution comprises cadmium acetate in water.

10. The method of claim 9 wherein said solution comprises a concentration of about 0.1 M cadmium acetate, Cd(C₂H₃O₂)₂ in water.

11. The method of claim 1 wherein up to 10 mole & InCl₃ is added to the starting solution.

12. The method of claim 1 wherein said solution is atomized at a rate of less than about 6 ml/minute.

13. The method of claim 1 wherein said gaseous sulfur-containing compound comprises H₂S.

14. The method of claim 13 wherein said gaseous sulfur-containing compound is contained in a mixture of H₂S and nitrogen.

15. The method of claim 14 wherein said mixture comprises about 20 percent by weight of H₂S in nitrogen.

16. The method set forth in claim 1 wherein said contacting continues for a time sufficient to form a layer of cadmium oxide having a thickness ranging from about 1 micron to about 3 microns.

17. The method set forth in claim 16 wherein said layer of cadmium sulfide is further characterized as having a crystallite grain size in excess of about 3 microns.

18. The method set forth in claim 1 wherein said annealing continues for a period ranging from about 30 minutes to about 8 hours in a mixture comprising 20% by weight of H₂S in nitrogen.

19. The method set forth in claim 1 wherein said substrate comprises glass.

20. The method set forth in claim 1 wherein said substrate comprises glass having a layer of tin oxide thereon.

21. The method set forth in claim 20 wherein said layer of cadmium sulfide is further characterized as having a resistivity less than about 60 Ω-cm.

22. The method set forth in claim 1 wherein said substrate comprises glass having a layer of indium oxide thereon.

* * * * *